United States Patent [19]
Iranmanesh

[11] Patent Number: 5,627,098
[45] Date of Patent: May 6, 1997

[54] METHOD OF FORMING AN ANTIFUSE IN AN INTEGRATED CIRCUIT

[75] Inventor: Ali A. Iranmanesh, Sunnyvale, Calif.

[73] Assignee: Crosspoint Solutions, Inc., Milpitas, Calif.

[21] Appl. No.: 592,039

[22] Filed: Jan. 26, 1996

Related U.S. Application Data

[62] Division of Ser. No. 221,637, Mar. 31, 1994, Pat. No. 5,514,900.
[51] Int. Cl.$^6$ .................... H01L 21/70; H01L 27/00
[52] U.S. Cl. .................... 438/600; 438/627; 438/643
[58] Field of Search ................. 437/60, 922, 195; 148/DIG. 55

[56] References Cited

U.S. PATENT DOCUMENTS

| | | | |
|---|---|---|---|
| 5,233,217 | 8/1993 | Dixit et al. | 257/530 |
| 5,373,169 | 12/1994 | McCollum et al. | 257/50 |
| 5,387,812 | 2/1995 | Forouhi et al. | 257/530 |

Primary Examiner—Jey Tsai
Attorney, Agent, or Firm—Townsend and Townsend and Crew LLP

[57] ABSTRACT

An antifuse structure in an integrated circuit including a first interconnection line, a second interconnection line formed over the first interconnection line, and a plurality of programming layers between the first and second interconnection lines. Each pair of programming layers has a metal layer therebetween which dissolves with the programming layers to form a conducting link during the programming of such antifuse structure. Such antifuse structure may also include a conductive plug between the programming layers and the second interconnection line.

14 Claims, 6 Drawing Sheets

METHOD OF FORMING AN ANTIFUSE IN AN INTEGRATED CIRCUIT

This is a division of application Ser. No. 08/221,637 filed Mar. 31, 1994, now U.S. Pat. No. 5,514,900.

BACKGROUND OF THE INVENTION

The present invention is related to integrated circuit structure and processing technology and, more particularly, to antifuses in integrated circuits and their manufacture.

Antifuses are found in a growing number of integrated circuits, most of which are field programmable gate arrays (FPGA's). As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a programming layer of antifuse material, such as amorphous silicon, is sandwiched between two metal interconnection lines. Depending upon the material of each metal interconnection layer, a layer of barrier metal, such as TiW (titanium-tungsten), is placed between the programming layer and each metal interconnection layer. Barrier metal layers function to block the undesired interdiffusion of material from a programming layer, such as amorphous silicon, and material from a metal layer, such as aluminum alloy. Barrier metal layers are typically refractory metals, their intermetallics, alloys, silicides, nitrides and combinations thereof.

However, various problems have been found with present antifuses. One problem is that the programmed resistance ($R_{ON}$) typically varies between 30 to 150 ohms, depending on the programming current ($I_{pp}$). While these values are low enough for FPGA's to operate quite adequately, even lower resistance values would significantly improve performance. Thus a goal of any antifuse is to lower $R_{ON}$ as much as possible.

A second problem with present antifuses is that $R_{ON}$ is sometimes unstable. With use, the programmed resistance of the antifuse sometimes drifts and increases to very high values which result in a device failure. For the programmed FPGA, the failure of one antifuse is disastrous since the programmed circuit is no longer realized in the integrated circuit.

The present invention solves or substantially mitigates these problems. A further advantage is that the present invention can be incorporated into existing antifuse processes without radical and expensive changes.

SUMMARY OF THE INVENTION

The present invention provides for an antifuse structure in an integrated circuit which has a first interconnection lines; a second interconnection line formed over the first interconnection line; and a plurality of programming layers between the first and second interconnection lines, each pair of programming layers having a metal layer therebetween. During the programming of the antifuse structure, the metal layer dissolves with the programming layers to form a conducting link between the first and second interconnection lines. The antifuse structure may have a relatively thick, insulating layer between the first and second interconnection lines. The insulating layer has a via therethrough with a conducting plug. The plurality of programming layers with the interstitial metal layers is located between the plug and the second interconnection line.

The present invention also provides for an antifuse structure in an integrated circuit, which has a first interconnection line; a second interconnection line formed over the first interconnection line; an insulating layer between the first and second interconnection lines with a via therethrough, the via holding a conducting plug therethrough; and a layer of barrier metal on top of the plug, the barrier metal having a predetermined viscosity so as to smooth irregularities on a top surface of the plug; and a programming layer between the layer of barrier metal and the second interconnection line.

The present invention further provides for a method of forming an antifuse in an integrated circuit having a first insulating layer on a semiconductor substrate. The method has the steps of: forming a first interconnection layer on the first insulating layer; forming a second insulating layer over the first metal interconnection layer; forming an aperture through the second insulating layer where the antifuse is to be located to expose a portion of the first interconnection layer; forming a first programming layer on the first interconnection layer; forming a barrier metal layer in the aperture on the first programming layer; forming a second programming layer on the barrier metal layer in the aperture; and forming a second interconnection layer on the barrier metal layer. Upon programming the antifuse, a consistent conducting link with a relatively low resistance is formed between the first and second metal interconnection layers.

Another alternative method of forming an antifuse in an integrated circuit having a first insulating layer on a semiconductor substrate is: forming a first interconnection layer on the first insulating layer; forming a second insulating layer over the first interconnection layer, the second insulating layer having a top surface; forming an aperture through the second insulating layer where the antifuse is to be located to expose a portion of the first interconnection layer; forming a metal plug in the aperture, the plug contacting the first interconnection layer and having a top surface substantially coplanar with said top surface of the second insulating layer; forming a first programming layer on the second insulating layer in contact with the top surface of the plug; forming a first layer of barrier metal in contact with and over the first programming layer; forming a second programming layer in contact with and over the barrier metal layer; and forming a second metal interconnection layer in contact with and on the second programming layer. Likewise, upon programming the resulting antifuse, a consistent conducting link with a relatively low resistance is formed between the first and second metal interconnection layers.

Finally, the present invention provides for another method of forming an antifuse in an integrated circuit having a first insulating layer on a semiconductor substrate. The method has the steps of: forming a first interconnection layer on the first insulating layer; forming a relatively thick, second insulating layer over the first interconnection layer, the second insulating layer having a top surfaces forming an aperture through the second insulating layer where the antifuse is to be located to expose a portion of the first interconnection layer; forming a metal plug in the aperture, the plug contacting the first interconnection layer and having a top surface substantially coplanar with the top surface of the second insulating layer; forming a layer of barrier metal in contact with and over the plug, said barrier metal having a predetermined viscosity so as to smooth irregularities on the top surface of said plug; forming a programming layer on the second insulating layer in contact with the top surface of the plug; and forming a second metal interconnection layer in contact with and on the second semiconductor layer.

BRIEF DESCRIPTION OF THE DRAWINGS

A more detailed understanding of the present invention may be achieved by perusing the following Detailed Description of Preferred Embodiments of the present invention with reference to the following drawings.

DETAILED DESCRIPTION OF PREFERRED EMBODIMENTS

Figure 1A:
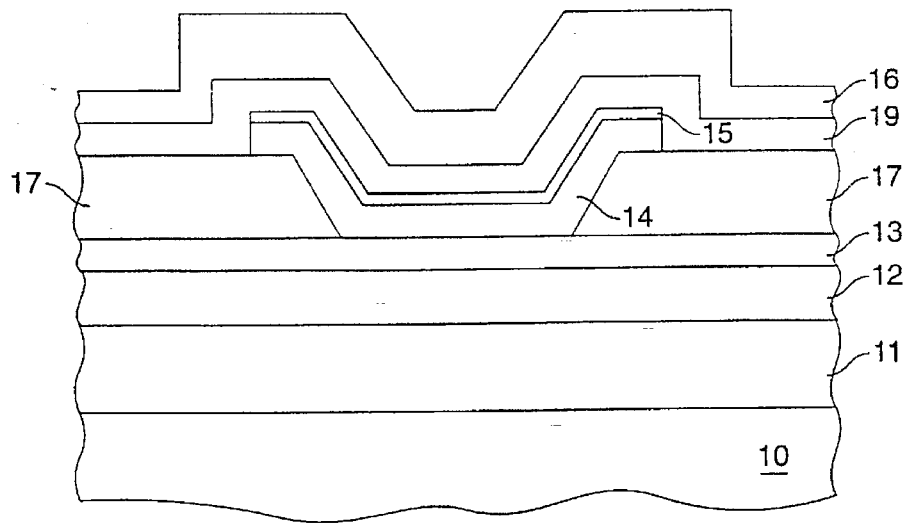
FIG. 1A is a cross-sectional diagram of a representative antifuse found in the prior art.
Figure 1B:
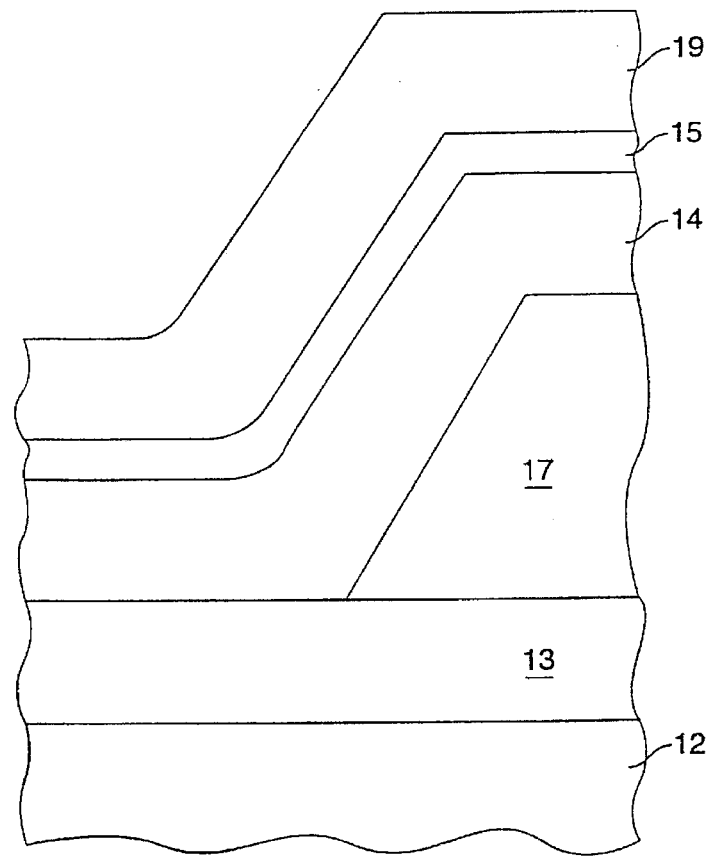
FIG. 1B is a detailed view of one corner of the antifuse of FIG. 1A.

FIG. 1A shows a cross-sectional view of a typical antifuse, and FIG. 1B is a detailed view of a corner of the antifuse of FIG. 1A. It should be noted that all of the drawings have been made to describe the antifuse structures in a representational sense and that no effort has been made to keep the various drawing components to scale.

The antifuse has a first metal layer 12 on top of an insulating layer 11 of silicon dioxide. The insulating layer 11 is formed on top of a semiconductor substrate 10 upon whose surface are formed various elements of an integrated circuit. These elements, such as transistors, are not shown in the drawings. The first metal layer 12 is typically formed from aluminum alloy. A first barrier metal layer 13, also called an electrode, is formed on top of the first metal interconnection layer 12. The layers 12 and 13 are delineated into one set of metal interconnection lines for the integrated circuit. A second insulating layer 17 of thick silicon dioxide material is placed over the first metal layer 12 and first barrier metal layer 13. Through an aperture, or via, through the layer 17, a programming layer 14 of amorphous silicon is formed on top of the second insulating layer 17 and in the via to contact the first barrier metal layer 13. The barrier metal layer 13 prevents the interdiffusion of the aluminum in the metal layer 12 with the silicon in the programming layer 14 of amorphous silicon.

On top of the programming layer 14, there is placed a thin barrier metal layer 15 or electrode, which protects the underlying programming layer 14 during subsequent processing steps. Where subsequent processing does not adversely affect the programming layer 14, the barrier metal layer 15 may be avoided. An antifuse mask is used to define the layers 14 and 15 in the via and its surrounding regions. A third barrier metal layer 19, which is followed by a second metal layer 16 of aluminum alloy, is deposited in contact with the barrier metal layer 15 and the edge of the programming layer 14. The layers 16 and 19 are delineated into another set of metal interconnection lines for the integrated circuit.

When an antifuse is programed by placing a large voltage across the metal interconnection lines (the layers 12, 13 and the layers 16, 19), a conducting link is formed through the nonconducting programming layer 14 between the barrier metal layers 13 and 15. Typically the link is formed at the corners of the antifuse in the via through the insulating layer 17 by the higher electric fields at the corners at the beginning of the programming process. These fields cause a breakdown of the programming layer 14 in those locations and the resulting high current densities melt the barrier metal layers 13 and 15 and the intermediate programming layer 14 into the fused link.

As noted above, there are two problems with present day antifuses. The resistance of the programmed antifuse can vary considerably from processed wafer to wafer, or even within an integrated circuit. The source of this problem appears to be the location of the conducting link. It is believed that the conductivity, or conversely, the resistance, of the programmed link is determined by the amount of barrier metal which combines with the silicon in the programming layer 14 of amorphous silicon to form the conducting metal silicide link. Since the link is located at the corner, there is a limited amount of barrier metal available, which limits the conductivity of the link. There is a constraint on how much $R_{ON}$ can be lowered.

The second problem is also related to the limited amount of barrier metal available for a conducting link of a programmed antifuse. It is believed that the conducting link forms as a metal silicide dendrite structure between the lower barrier metal layer 13 and upper barrier metal layers 15, 19. As current through the programmed antifuse increases, the voltage across the antifuse rises in a linear relationship indicative of a fixed resistance, $R_{ON}$, in this case. At some point the relationship is broken and, as the current is further increased, the antifuse appears to be open. After the antifuse is "rested," current once again passes through the antifuse at a new, higher $R_{ON}$ resistance. What appears to be happening is that the high current densities through the thin dendrite branches of metal silicide eventually cause the branches to melt, thereby causing an open circuit. Upon resting the antifuse, the branches cool and reform with even higher resistance.

Likewise, it is believed that upon the programming of antifuses, some of the dendrite links form extra thin branches. Over time, the operational currents passing through these dendrite branches cause the branches to breakdown and melt. The branches reform with higher resistances. Thus some of the programmed antifuses are unreliable.

To overcome these problems, the present invention allows more barrier metal to be drawn into the programmed link so that $R_{ON}$ overall is lower. The conducting dendrite branches are thickened and resistance lowered so the conducting link can handle the operational currents without melting. A programmed metal silicide link with lower resistance and greater reliability is created.

Figure 2A:
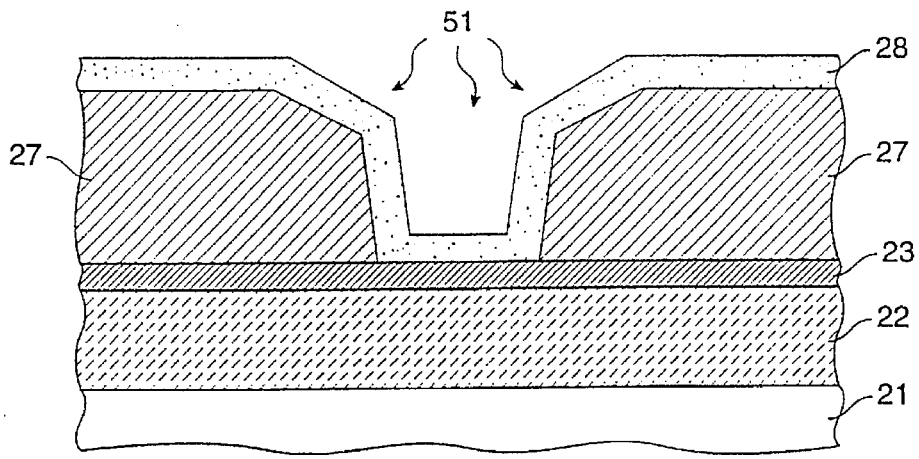
FIGS. 2A–2G show a eloquence of steps used to manufacture an antifuse structure according to one embodiment of the present invention.

Rather than a single programming layer of the prior art, the present invention provides for a sandwich structure, i.e., a plurality of programming layers having a barrier layer between each pair of programming layers. FIGS. 2A–2G illustrate the steps in the manufacture of an antifuse according to the present invention. FIG. 2A illustrates a particular point in the process of manufacturing a prior art antifuse, at which point the present invention diverges.

As shown in FIG. 2A, after a first metal interconnection line is formed by masking and etching an aluminum alloy layer 22 and a barrier metal layer 23 of titanium-tungsten on an insulating layer 21 of silicon dioxide. The layer 21 covers a semiconductor substrate (not shown) and other elements, such as transistors of the integrated circuit of which the antifuse to be formed is a part. A thick interlayer dielectric layer 27 of undoped silicate glass, borophosphosilicate glass (BPSG) or phosphosilicate glass (PSG) is deposited by chemical vapor deposition to a thickness ranging from 5,000 to 10,000 Å over the insulating layer 21 and metal layers 22, 23. By standard photolithographic and etching techniques, a via is then created in the insulating layer 27 where an antifuse is to be located. The via sides shown include two slopes but may also have a single slope or multiple slopes, depending upon the particular application.

Figure 2B:
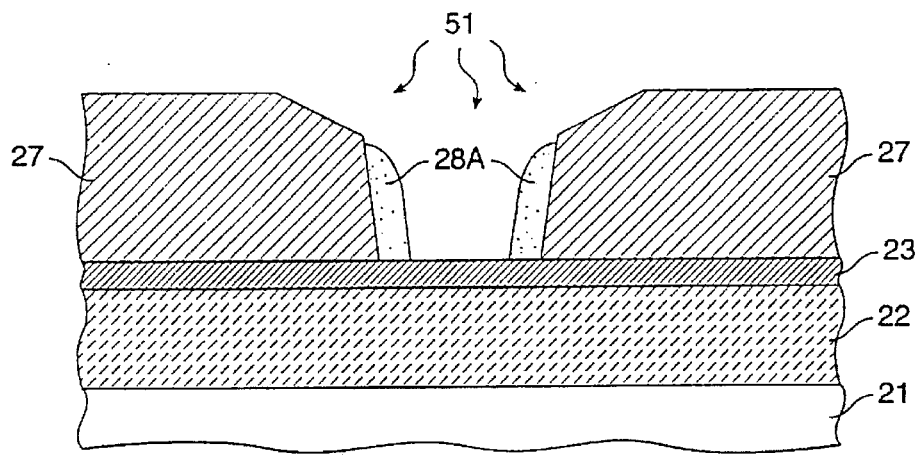

A semiconductor layer 28 of amorphous silicon is then deposited over the insulating layer 27 and into the via 51. The amorphous silicon is deposited by plasma-enhanced chemical vapor deposition from 800 to 1200 Å thick with a hydrogen content of 10–20% by composition. The thickness and hydrogen content depend on the desired programming voltage. By selecting an isotropic reactive ion etching technique, the amorphous silicon layer 28 is removed from the top of the insulating layer 27 and bottom of the via 51. Spacer regions 28A are left in the via 51 on the sidewalls of the insulating layer 27 formed in the via 51. This step is shown in FIG. 2B. Besides amorphous silicon for the layer 28, it should be noted that other nonconducting materials, such as silicon dioxide, undoped polysilicon, or silicon nitride, may be used so that the spacer regions 28A may also be formed from these materials.

Figure 2C:
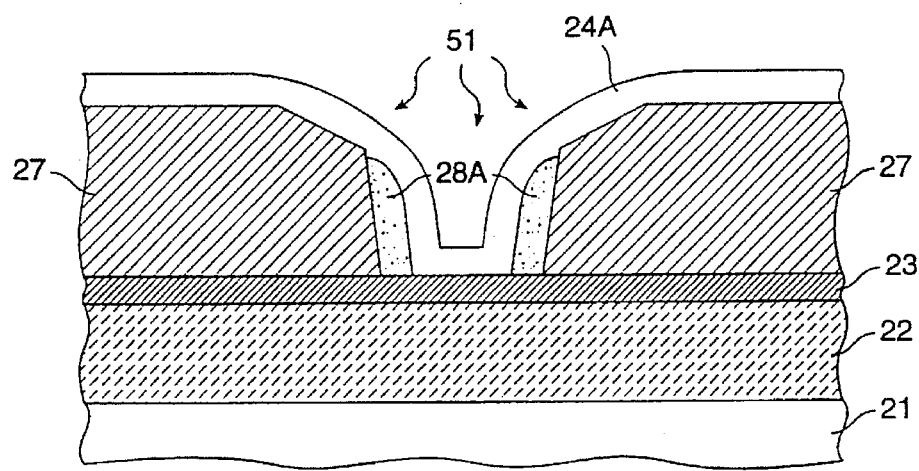
Figure 2D:
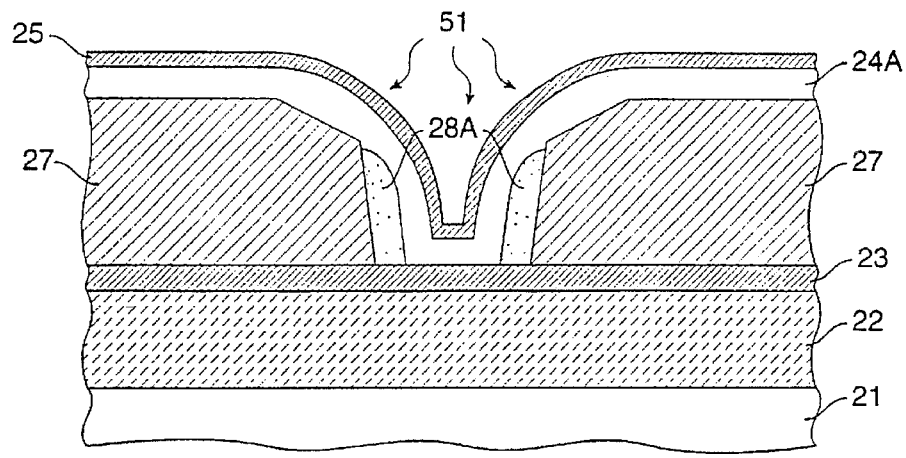
Figure 2E:
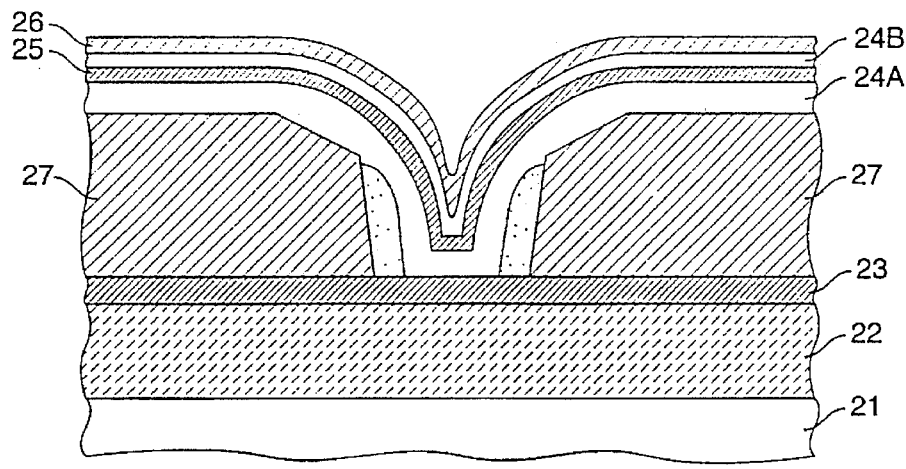

As shown in FIG. 2C, a programming layer 24A of undoped amorphous silicon is then deposited by plasma-enhanced chemical vapor deposition over the insulating layer 27 and into the via 51. The thickness of the layer 24A is approximately 400–600 Å with a hydrogen content from 10–20% by composition. The thickness and hydrogen content of layer 24A depend on the desired programming voltage. A thin barrier metal layer 25 of titanium tungsten is then sputtered over the layer 24A. The thickness of layer 25 may range from 150–400 Å, and also depends on the desired programming voltage. This is shown in FIG. 2D.

Another semiconductor programming layer 24B of undoped amorphous silicon is then deposited by plasma-enhanced chemical vapor deposition. The layer 24B may also be from 400–600 Å thick with 10–20% hydrogen by composition. Besides amorphous silicon for the programming layers 24A and 24B, other nonconducting layers may be used, such as silicon dioxide, silicon nitride or undoped polysilicon may also used. This is followed by a thin layer 26 of sputtered barrier metal of titanium-tungsten (TiW) from 500 to 1500 Å thick. This layer 26, shown in FIG. 2E, helps protect the semiconductor layers 24A and 24B during subsequent processing steps. As explained above, if subsequent processing does not adversely affect the programming layers 24A and 24B, the layer 26 may be avoided.

Figure 2F:
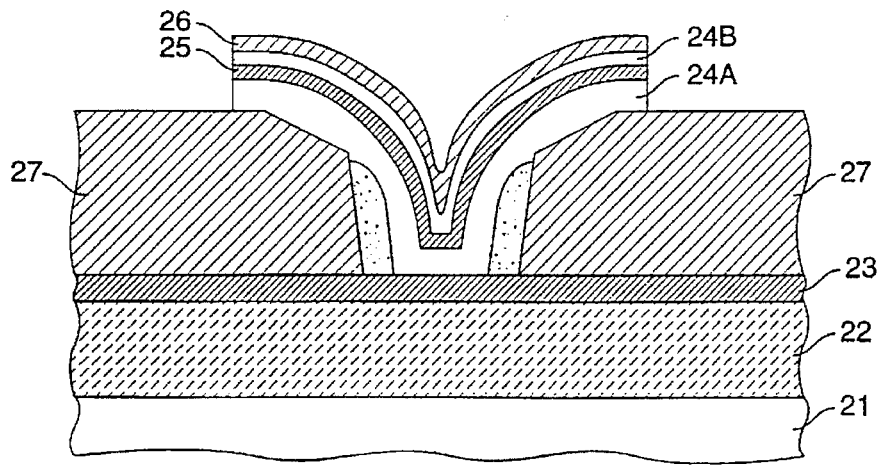

With an antifuse mask, the layers 24A, 25, 24B, and 26 are masked and etched to leave portions of these layers in the via and extending partly onto the top of the insulating layer 27. The result of this step in the processing is illustrated in FIG. 2F.

Figure 2G:
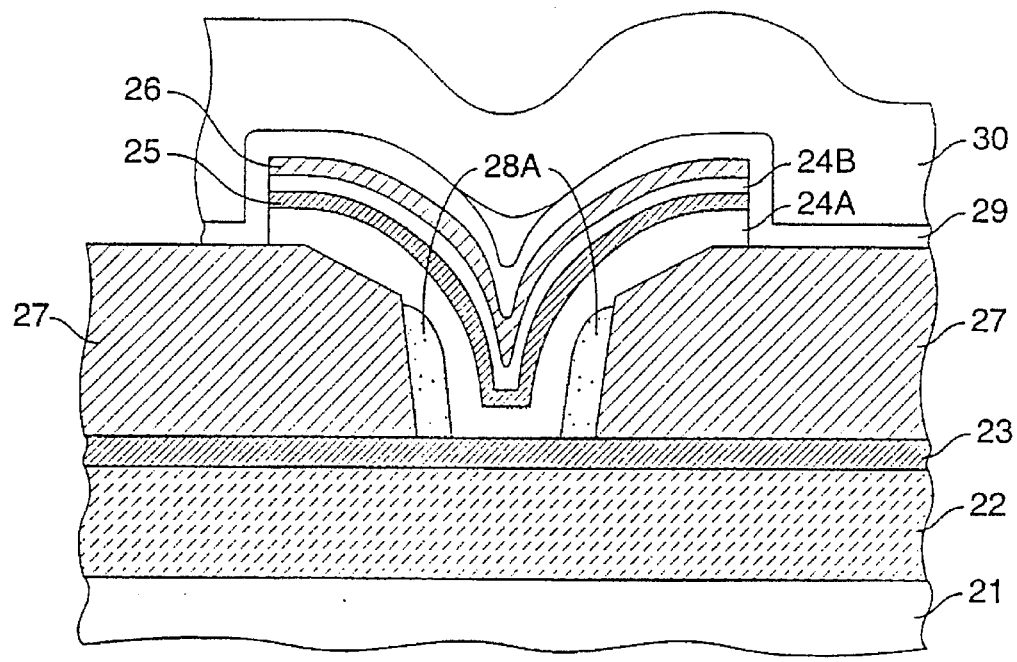

FIG. 2G shows the completed antifuse structure. A barrier metal layer 29 of TiW is deposited by sputtering over the remaining layers 24A, 25, 24B, and 26. Then a layer 30 of aluminum alloy is deposited. The thicknesses of the layers 29 and 30 are 500 to 1200 Å, and 6000 to 12000 Å, respectively. The layers 29 and 30 are masked and etched to form the second interconnection line.

Programming of the antifuse structure connects the first metal interconnection line formed by the layers 22 and 23 and the second interconnection line formed by the layers 29 and 30. The intermediate barrier metal layer 25 provides additional metal for the silicide link between first and second interconnection lines. The spacer regions 28A ensure that the programming link is formed away from the sidewalls and towards the center of the via 51 to increase the availability of barrier metal in creating the conducting silicide link. Other advantages and further details of spacer regions in antifuse structure are disclosed in the applicant's patent application, U.S. Ser. No. 08/221,344, entitled, "METHOD OF MANUFACTURING AN ANTIFUSE WITH SILICON SPACERS AND RESULTING ANTIFUSE," filed of even date and assigned to the present assignee.

It should be noted that, besides TiW, other materials including titanium and doped TiW may be used for the barrier metal layer between the programming layers in the antifuse. Furthermore, polysilicon, silicon dioxide and silicon nitride may be used as antifuse materials for the programming layers.

Figure 3:
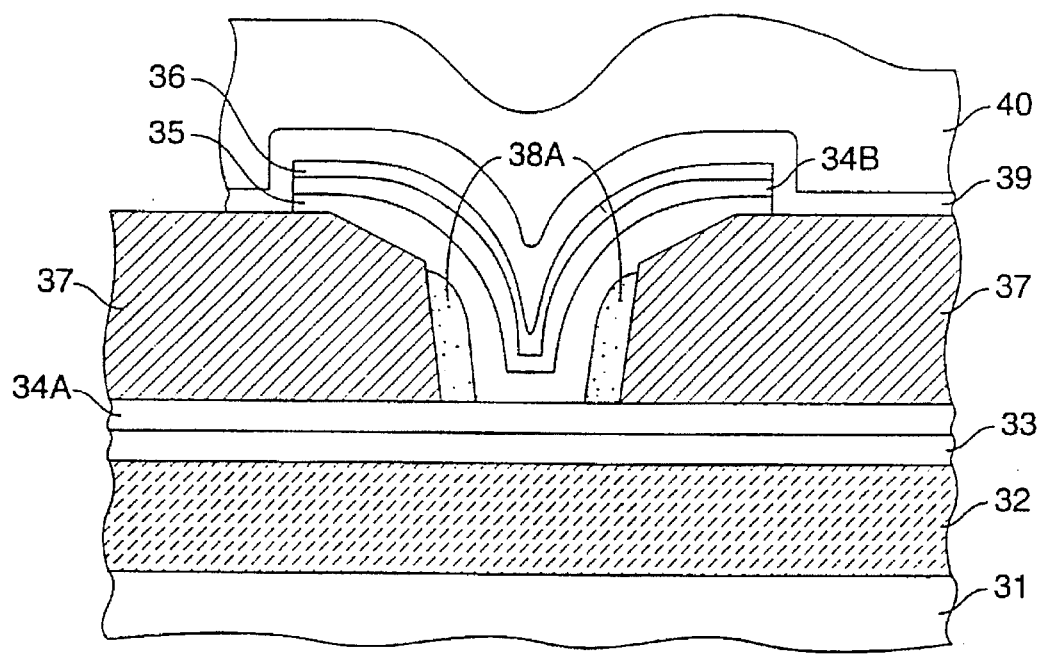
FIG. 3 illustrates another embodiment of the present invention, a variation of the antifuse structure of FIG. 2G.

FIG. 3 illustrates another embodiment of the present invention. In this variation of the process illustrated in FIGS. 2A–2G, a programming layer 34A of amorphous silicon is deposited upon a barrier metal layer 33, which is part of the first interconnection line formed by an aluminum alloy layer 32 and the layer 33. The amorphous silicon layer 34A may foe defined with the delineation of the first interconnection line, or may be deposited after the layers 32 and 33 are defined. A thick insulating layer 37 of interlayer dielectric is then deposited and a via formed in the layer 37 where an antifuse is to be located. The steps illustrated by FIGS. 2A and 2B are then repeated to create spacer regions 38A in the via.

Then, instead of a programming layer of amorphous silicon, a barrier metal layer 35 of titanium-tungsten is deposited into the via with the spacer regions 38A. A second semiconductor programming layer 34B of amorphous silicon is then deposited followed by a protective capping layer 36 of titanium tungsten. These steps are similar to those described with respect to FIG. 2E. The layers 35, 34B and 36 are then defined by an antifuse mask and etched so that only portions of these layers in the via and the surrounding areas remain. Depositions of a barrier metal layer 39 and aluminum alloy layer 40 then follow. The two layers 39 and 40 are masked and etched to form the second interconnection line.

In this embodiment of the present invention, the antifuse sandwich structure is formed by the amorphous silicon layer 34A on the first interconnection line, the titanium tungsten layer 35 and the second amorphous silicon layer 34B in the via.

Figure 4A:
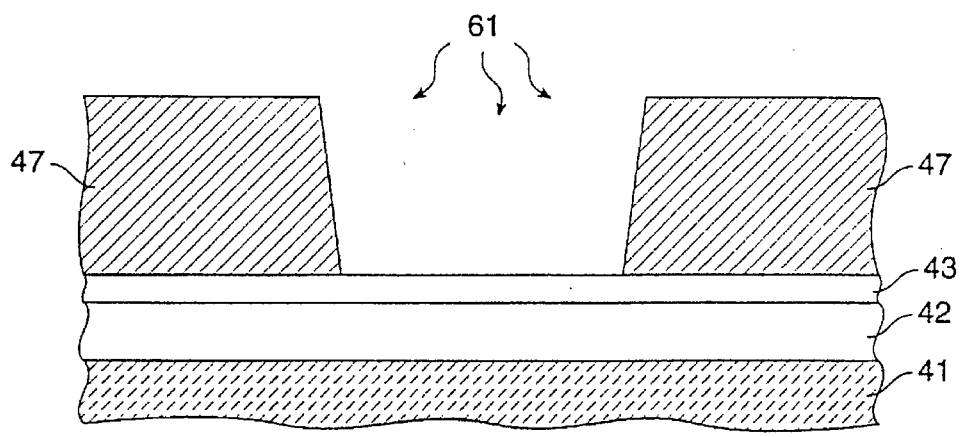
FIGS. 4A–4F show a sequence of steps used to manufacture an antifuse structure according to another embodiment of the present invention.
Figure 4B:
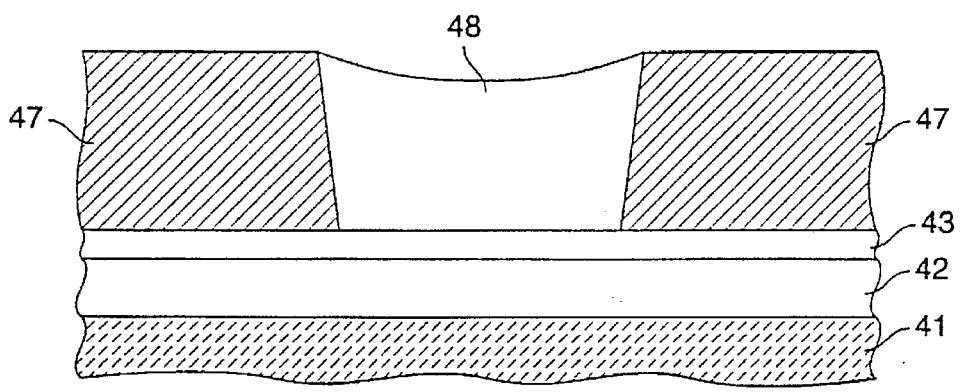

An inverted antifuse structure incorporating the present invention is illustrated in FIGS. 4A–4F. FIG. 4A illustrates the starting point of the process to manufacture the antifuse. After an aluminum layer 42 and a barrier metal layer 43 are deposited on an insulating layer 41 on a substrate (not shown), the layers 42 and 43 are delineated into a first interconnection line. Then a thick interdielectric layer 47 from 5,000 to 15,000 Å is deposited. A via 61 is formed wherever an antifuse is to be constructed.

A thick refractory metal layer of tungsten is deposited in a blanket over the layer 47 and into the via 61. Then the layer is etched back so that the top of the tungsten layer is approximately level with the top surface of the insulating layer 47 to form a tungsten plug 48 in the via 61. Note that a thin layer of titanium tungsten alloy or titanium nitride may be deposited before the tungsten layer 48 to act as a nucleating and adhesion layer for the tungsten layer which form the plug 48. Alternatively, selective deposition techniques of refractory metal may be used to fill the via 61 to form the plug 48. These processes to form refractory metal plugs in antifuses structures are discussed in U.S. Pat. No. 5,233,217, which issued Aug. 3, 1993 to Pankaj Dixit et al., and assigned to the present assignee.

Besides tungsten, copper, aluminum, or other suitable materials may also be used for tire plug 48. Deposition of these materials may be done by chemical vapor deposition or electroplating.

A thin refractory metal layer 52 is then sputtered over the plug 48, and on the surface of the insulating layer 47. Despite the fact that the layer 48 is formed from tungsten, a refractory metal, it has been found that a layer of a refractory metal which is viscous, such as titanium-tungsten alloy or titanium nitride compound, is highly beneficial for the operation of the antifuse to be constructed. The viscous barrier metal layer 52 smoothes the irregularities which are typically found on the top surfaces of tungsten plugs. Thus the deposition of a barrier metal layer with particular properties of viscosity over a refractory metal plug, has benefits beyond the particular process being described, including the processes described in the patent noted immediately above. A viscous barrier metal layer placed over a plug and under a single programming layer of amorphous silicon, as described in the patent, creates a much more reliable antifuse. For example, if the plug material is incompatible with the formation of a reliable antifuse with acceptable performance characteristics, the layer 52 insulates the plug from the antifuse. For the present invention and the particular plug 48, a overlying layer 52 of titanium-tungsten with a thickness from 500 to 1500 Å works very well.

Figure 4C:
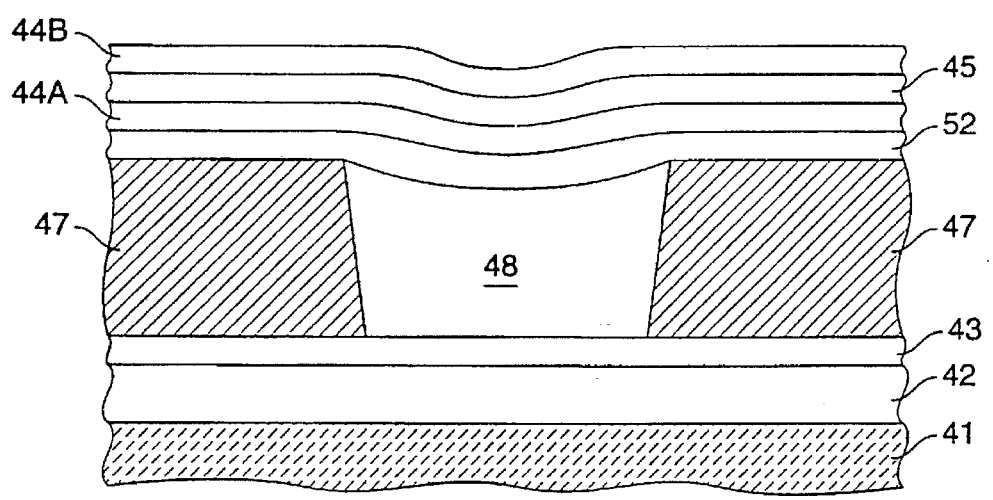

After the deposition of the layer 47, an antifuse sandwich structure is formed over the layer 52. That is, a first programming layer 44A of amorphous silicon is deposited by plasma-enhanced chemical vapor deposition to a thickness of 400–600 Å with a hydrogen content of 10–20% by atomic weight, followed by sputtering of a barrier metal layer 45 of titanium-tungsten to a thickness of 150–400 Å, which is in turn followed by a second programming layer 44B of 400–600 Å of amorphous silicon. At this stage, the antifuse structure is illustrated in FIG. 4C.

Figure 4D:
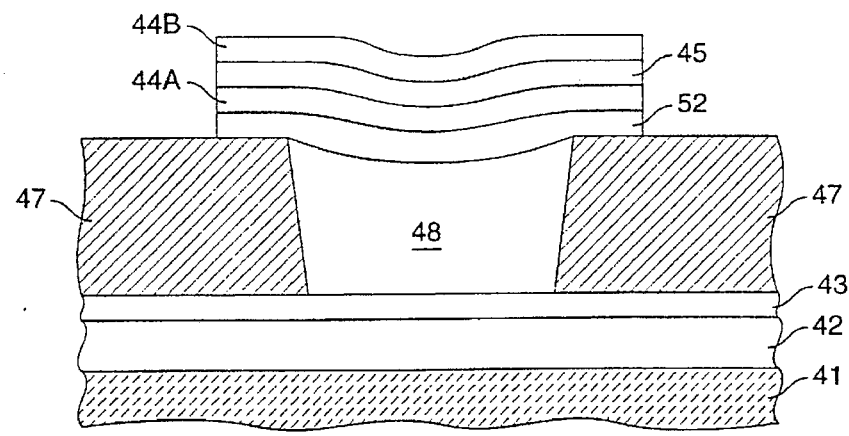

With an antifuse mask, the layers 44A, 45, 44B and 52 are then masked and etched to leave a portion of these layers on the plug 48, as shown in FIG. 4D. Not shown in the drawings is a discretionary capping layer of TiW, discussed with respect to previous embodiments of the present invention, deposited over the programming layer 44B. If deposited to protect the layer 44B from the adverse effects of subsequent processing, the capping layer is masked and etched in the same step as layers 44A, 45, 44B and 52.

Figure 4E:
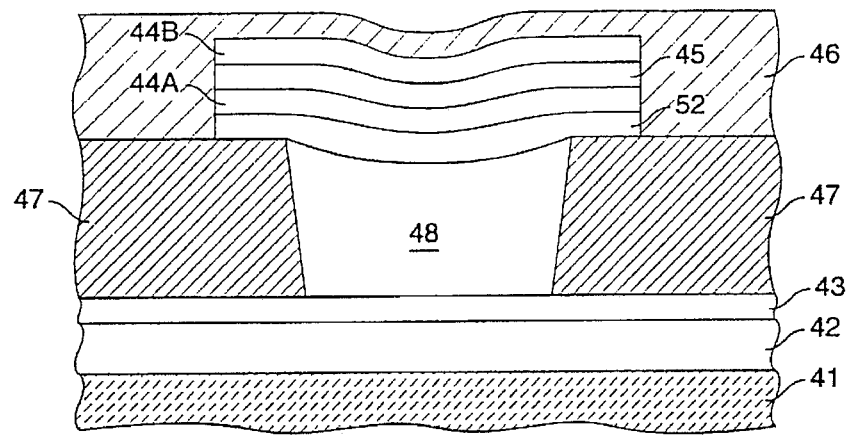

As shown in FIG. 4E, another insulating layer 46 of a silicon dioxide composition is then deposited by chemical vapor deposition to a thickness of 1000 to 2000 Å. The layer 46 may also be undoped silicate glass, borophosphosilicate glass (BPSG) or phosphosilicate glass (PSG). The insulating layer 46 protects the edges of the layers 52, 44A, 45, 44B and, in particular, prevents a short circuit around the amorphous silicon layers 44A and 44B when the second interconnection line is formed over these layers. A via is made through the top of the insulating layer 46 to expose the top surface of the amorphous silicon layer 44B (or the TiW capping layer over the layer 44B). Then by sputtering, a barrier metal layer 49 and aluminum alloy layer 50 is deposited. The two layers 49 and 50 are then masked and etched to define a second interconnection line of the integrated circuit.

Figure 4F:
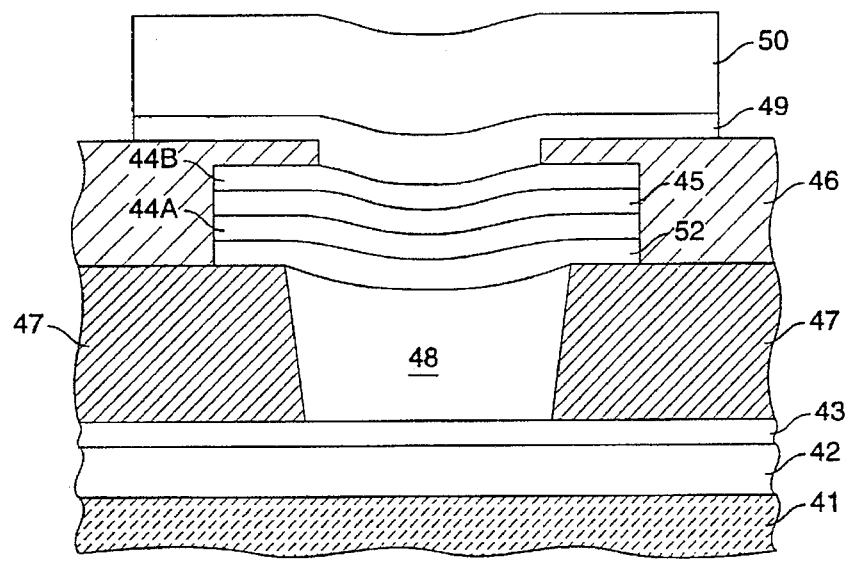

The completed antifuse structure is shown in FIG. 4F. As noted in the previous embodiments of the present invention, the antifuse structure in FIG. 4F has an intermediate barrier metal layer 45 which adds to the conductivity and reliability of the conducting link upon the programming of the antifuse. Such completed antifuse structure also possesses a planar configuration which eliminates the higher electric fields near the corners of the prior art antifuse structure.

While the above is a complete description of the preferred embodiments of the invention, various alternatives, modifications and equivalents may be used. It should be evident that the present invention is equally applicable by making appropriate modifications to the embodiments described above. For example, in place of the amorphous silicon in the semiconductor programming layers in the antifuse, ocher semiconductor materials, such as silicon dioxide or silicon nitride, may be used. Furthermore, multiple layers of semiconductor material with layers of barrier metal between each pair of semiconductor layers may be used in place of the single sandwich structure of amorphous silicon-barrier metal-amorphous silicon structures described between the interconnection lines. Therefore, the above description should not be taken as limiting the scope of the invention which is defined by the metes and bounds of the appended claims.

What is claimed is:

1. A method of forming an antifuse in an integrated circuit having a first insulating layer on a semiconductor substrate, said method comprising:

forming a first interconnection layer on said first insulating layer;

forming a second insulating layer over said first metal interconnection layer;

forming an aperture through said second insulating layer where said antifuse is to be located to expose a portion of said first interconnection layer;

forming a first programming layer on said first interconnection layer;

forming a barrier metal layer in said aperture on said first programming layer;

forming a second programming layer on said barrier metal layer in said aperture; and forming a second interconnection layer on said barrier metal layer;

whereby, upon programming said antifuse, a consistent conducting link is formed between said first and second metal interconnection layers.

2. The method of claims 1 wherein said first programming layer forming step is performed before said second insulating layer forming step.

3. The method of claim 1 wherein said first programming layer forming step is performed after said second insulating layer aperture forming step.

4. The method of claim 1 wherein said first and second programming layers comprise amorphous silicon.

5. The method of claim 1 further comprising forming an insulating spacer region on sides of said second insulating layer in said aperture and on part of said first interconnection layer portion next to said second insulating layer sides.

6. The method of claim 5 wherein said spacer region comprises amorphous silicon.

7. A method of forming an antifuse in an integrated circuit having a first insulating layer on a semiconductor substrate, said method comprising:

forming a first interconnection layer on said first insulating layer;

forming a second insulating layer over said first interconnection layer, said second insulating layer having a top surface;

forming an aperture through said second insulating layer where said antifuse is to be located to expose a portion of said first interconnection layer;

forming a metal plug in said aperture, said plug contacting said first interconnection layer and having a top surface substantially coplanar with said top surface of said second insulating layer;

forming a first programming layer on said second insulating layer in contact with said top surface of said plug;

forming a first layer of barrier metal in contact with and over said first programming layer;

forming a second programming layer in contact with and over said barrier metal layer; and forming a second metal interconnection layer in contact with and on said second programming layer;

whereby, upon programming said antifuse, a consistent conducting link is formed between said first and second metal interconnection layers.

8. The method of claim 7 wherein said first and second programming layers comprise amorphous silicon.

9. The method of claim 7 wherein said metal plug comprises a refractory metal.

10. The method of claim 7 wherein said metal plug comprises tungsten.

11. The method of claim 7 further comprising forming a second layer of barrier metal in contact with and over said plug, said barrier metal of said second layer having a viscosity so as to smooth irregularities on the top surface of said plug.

12. The method of claim 11 wherein said second layer of barrier metal forming step comprises sputtering a layer of titanium-tungsten with a thickness in the range of 500 to 1500 Å.

13. A method of forming an antifuse in an integrated circuit having a first insulating layer on a semiconductor substrate, said method comprising:

forming a first interconnection layer on said first insulating layer;

forming a second insulating layer over said first interconnection layer, said second insulating layer having a top surface;

forming an aperture through said second insulating layer where said antifuse is to be located to expose a portion of said first interconnection layer;

forming a metal plug in said aperture, said plug contacting said first interconnection layer and having a top surface substantially coplanar with said top surface of said second insulating layer;

forming a layer of barrier metal in contact with and over said plug, said barrier metal having a viscosity so as to smooth irregularities on the top surface of said plug;

forming a programming layer on said second insulating layer in contact with a top surface of said barrier metal; and forming a second metal interconnection layer in contact with and on said programming layer.

14. The method of claim 13 wherein said layer of barrier metal forming step comprises sputtering .a layer of titanium-tungsten with a thickness in the range of 500 to 1500 Å.

* * * * *